(12) United States Patent
Havlik et al.

(10) Patent No.: US 9,787,323 B1
(45) Date of Patent: Oct. 10, 2017

(54) HUFFMAN TREE DECOMPRESSION

(71) Applicant: Microsoft Technology Licensing, LLC, Redmond, WA (US)

(72) Inventors: Robert W. Havlik, Fort Collins, CO (US); Michael J. Erickson, Fort Collins, CO (US); Amar Vattakandy, Longmont, CO (US); Derek E. Gladding, Pacifica, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/474,748

(22) Filed: Mar. 30, 2017

Related U.S. Application Data

(60) Provisional application No. 62/432,630, filed on Dec. 11, 2016.

(51) Int. Cl.
*H03M 7/40* (2006.01)
*H03M 7/42* (2006.01)

(52) U.S. Cl.
CPC .................................. *H03M 7/425* (2013.01)

(58) Field of Classification Search
CPC ...... H03M 7/425; H03M 7/40; H03M 7/4031; H03M 7/42
USPC .................................. 341/67, 50, 51, 59, 106
See application file for complete search history.

(56) References Cited

U.S. PATENT DOCUMENTS

| | | | |
|---|---|---|---|
| 5,481,364 A | 1/1996 | Ito | |
| 5,509,088 A * | 4/1996 | Robson | H03M 7/425 341/67 |
| 5,528,628 A | 6/1996 | Park et al. | |
| 5,550,542 A * | 8/1996 | Inoue | H03M 7/425 341/67 |
| 5,638,069 A * | 6/1997 | Rensink | H03M 7/425 341/50 |
| 5,848,195 A | 12/1998 | Romriell | |
| 6,075,470 A | 6/2000 | Little et al. | |
| 6,373,412 B1 | 4/2002 | Mitchell et al. | |
| 6,411,227 B1 * | 6/2002 | Fish | H03M 7/3086 341/51 |
| 6,417,788 B1 * | 7/2002 | McEwen | G11B 5/09 341/59 |
| 6,563,440 B1 | 5/2003 | Kangas | |
| 6,700,513 B2 * | 3/2004 | McGuire | H03M 7/40 341/106 |
| 6,771,824 B1 | 8/2004 | Chiu et al. | |

(Continued)

OTHER PUBLICATIONS

Pham, et al., "An Adaptive, Memory-Efficient and Fast Algorithm for Huffman Decoding and Its Implementation", In Proceedings of the 2nd International Conference on Interaction Sciences: Information Technology, Culture and Human, Nov. 24, 2009, pp. 275-279.

*Primary Examiner* — Jean B Jeanglaude

(57) ABSTRACT

To decompress encoded data, a Huffman code tree stored in a data header may need to be decompressed and rebuilt. A bit length histogram table is used in a hardware design to more efficiently decompress the Huffman code tree. The bit length histogram table relates each bit length used by the Canonical Huffman Code (CHC) symbols to a corresponding number of symbols in the encoding that have that bit length. Performing decompression using bit length histogram table allows part of the Huffman tree decompression to be performed in a single pass.

20 Claims, 8 Drawing Sheets

(56) References Cited

U.S. PATENT DOCUMENTS

| | | | |
|---|---|---|---|
| 7,573,405 B2* | 8/2009 | Shima | H03M 7/40 341/107 |
| 8,306,108 B2* | 11/2012 | Lu | H03M 7/425 375/240.02 |
| 8,488,894 B2 | 7/2013 | Cheng | |
| 8,565,320 B2 | 10/2013 | Jang et al. | |
| 8,593,308 B1 | 11/2013 | Biran et al. | |
| 8,988,257 B2* | 3/2015 | Dickie | H03M 7/4037 341/106 |
| 9,094,039 B2 | 7/2015 | Wu et al. | |
| 9,225,355 B2* | 12/2015 | Harnik | H03M 7/40 |
| 2001/0050682 A1 | 12/2001 | Deering et al. | |

* cited by examiner

HUFFMAN TREE DECOMPRESSION

RELATED APPLICATIONS

This application claims the benefit of U.S. Application Ser. No. 62/432,630, filed Dec. 11, 2016, the contents of which are incorporated herein by reference in its entirety for all purposes.

BACKGROUND

A part of some widely-used data compression standards encodes data into symbols via entropy encoding. A method for entropy encoding is known as Huffman Coding. In Huffman coding, Huffman codes are dynamically assigned to symbols based on the frequency of each symbol. The set of codes is called the Huffman Tree. When the Huffman tree is built for a set of data, the tree can also be compressed and stored with the data. Thus, to decompress the encoded data, the Huffman code tree needs to be decompressed and rebuilt.

SUMMARY

Examples discussed herein relate to an integrated circuit to decode data compressed with a variable length code expressed in canonical form. The integrated circuit includes a first table, stored in storage elements, to associate a plurality of unencoded symbols to a corresponding plurality of coded symbol bitlengths. Each of these coded symbol bitlengths correspond to a count of bits used by the variable length code to encode a corresponding unencoded symbol. A second table, stored in storage elements, associates each of the corresponding plurality of bitlengths to a respective starting index. Circuitry to generate the second table is included. A decode lookup, stored in storage elements, is also included. Circuitry generates the decode lookup table based on the first table and the second table.

In an example, a method of generating a decode lookup table to decode a variable length code expressed in canonical form includes receiving a first table that associates a plurality of unencoded symbols to a corresponding plurality of coded symbol bitlengths. Each of the coded symbol bitlengths corresponds to a count of bits used by the variable length code to encode a corresponding unencoded symbol. The method also generates a second table that associates each of the corresponding plurality of bitlengths to a respective starting index. The decode lookup table is generated based on the first table and the second table.

In an example, an integrated circuit to decompress data compressed with a variable length coding scheme includes decompression circuitry and table decompression circuitry. The decompression circuitry receives the compressed data and, based on a symbol lookup table, produces decompressed data. The table decompression circuitry receives a representation of the symbol lookup table and produces the symbol lookup table from that representation. The representation of the symbol lookup table includes a plurality of coded symbol bitlengths corresponding to a count of bits used by the variable length coding to encode a corresponding unencoded symbol. The table decompression circuitry produces a symbol lookup table suitable for decoding from the representation of the symbol lookup table by at least: generating a cumulative histogram table that associates each of the corresponding plurality of bitlengths to a respective starting index in the symbol lookup table; and, generating the symbol lookup table based on the representation of the symbol lookup table and the cumulative histogram table.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

In some data compression algorithms and/or standards, codes are dynamically assigned to symbols. For example, in Huffman coding, codes are dynamically assigned to symbols based on the frequency of each symbol. The set of codes is called the Huffman Tree. When the Huffman tree is built for a set of data, the tree can also be compressed and stored with the data. Thus, to decompress the encoded data, the Huffman code tree needs to be decompressed and rebuilt. A bit length histogram table is used in a hardware design to more efficiently decompress a Huffman code tree. The bit length histogram table relates each bit length used by the Canonical Huffman Code (CHC) symbols to a corresponding number of symbols in the encoding that have that bit length. Performing decompression using bit length histogram table allows at least part of the decompression of the symbol table to be performed in a single pass. Example compression algorithms and/or standards, that dynamically assign codes to symbols include, but are not limited to, GZIP (RFC 1952), ZLIB (RFC 1950), and the Xpress compression standard(s) from Microsoft.

Figure 1:
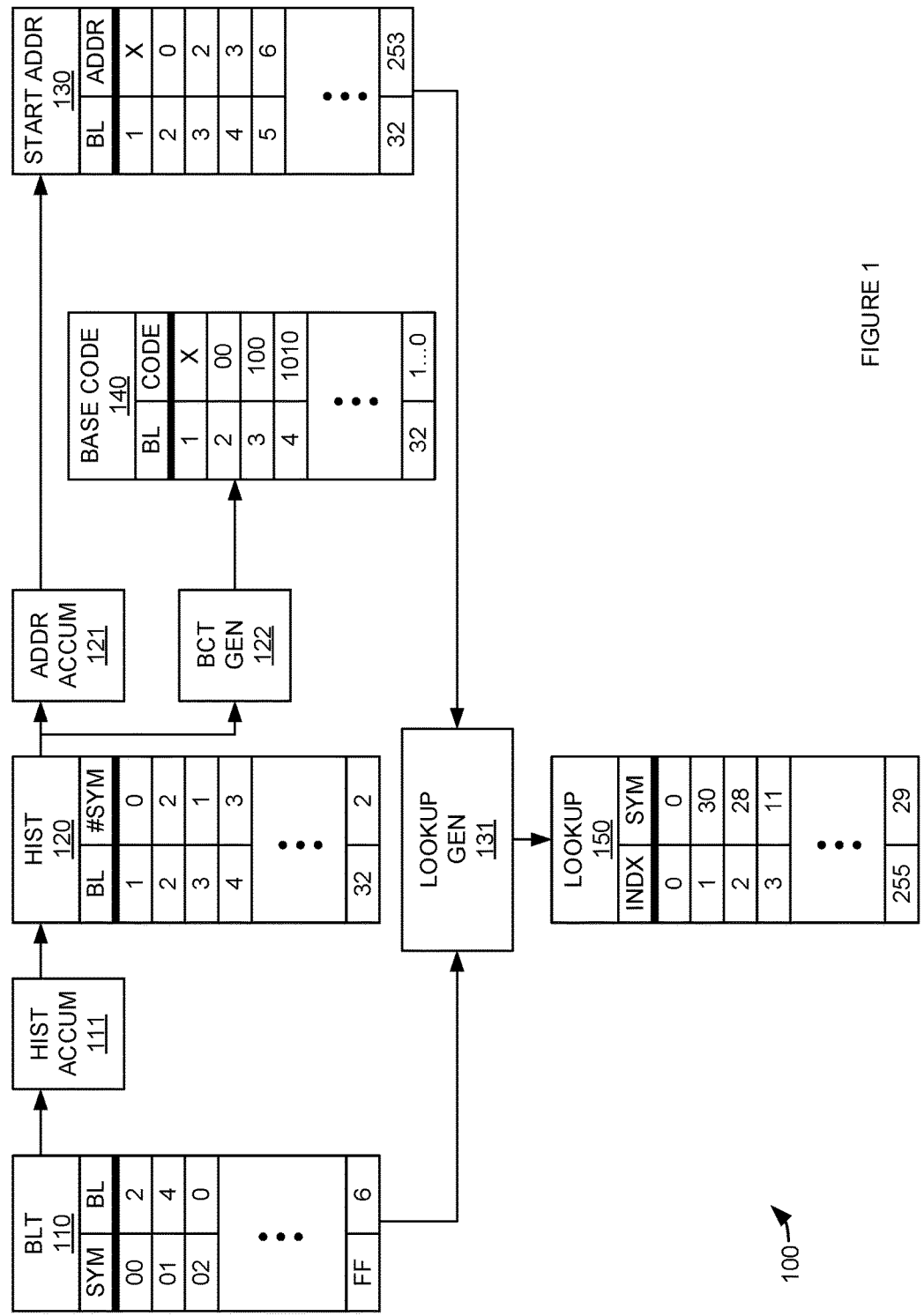
FIG. 1 is a block diagram illustrating elements of an integrated circuit that decode a compressed decode table.

FIG. 1 is a block diagram illustrating elements of an integrated circuit that decode a compressed decode table. In an embodiment, an integrated circuit 100 for hardware decompression includes bit length table (BLT) 110, histogram accumulator 111, histogram 120, address accumulator 121, base code generator 122, start address table (SAT) 130, base code table (BCT) 140, lookup table generator 131, and symbol lookup table (SLT) 150.

Bit length table 110 is comprised of storage elements that relate unencoded symbol value to the number of bits used to represent that symbol in the compressed (a.k.a., encoded) data stream. For example, bit length table 110 associates unencoded symbol values to encoded symbol bit lengths. In FIG. 1, bit length table 110 is illustrated with the symbol values in the left-hand column and bit lengths in a right-hand column. The example symbol values shown in FIG. 1 illustrate an association of the unencoded symbol value 02h as being represented by an encoded symbol having two (2) bits; the unencoded symbol of 01h corresponding to an encoded symbol having bit length of four (4) bits; the unencoded symbol of 02h corresponding to an encoded symbol having a bit length of zero (0) bits; and, so on with the unencoded symbol of FFh corresponding to an encoded symbol having a bit length of six (6) bits. In an embodiment, an encoded symbol with a bit length of zero means the corresponding unencoded symbol does not appear in the uncompressed data stream.

It should be understood, that bit length table 110 can fully represent a compression/decompression encoding/decoding. In particular, bit length table 110 can fully represent a compression/decompression encoding/decoding that is constructed according to the rules for constructing a Canonical Huffman Code (CHC).

In FIG. 1, bit length table 110 is provided to histogram accumulator 111 and lookup table generator 131. Bit length table 110 may be provided to histogram accumulator 111 and/or lookup generator 131 one entry at a time. In other words, bit length table 110 may be provided to histogram accumulator 111 is a series of bit length values that correspond to numerically ascending (or alternatively, descending) symbol values. Histogram accumulator 111 counts the number of unencoded symbols that have a given bit length and populates histogram 120 with these values.

Histogram 120 is a table comprised of storage elements that relates the total number of encoded symbols of a given size (i.e., bit lengths) to that size. For example, histogram table 120 associates the respective bitlengths of the encoded symbol values to the number of symbols having those respect bitlengths. In FIG. 1, histogram 120 is illustrated with the bit length values in the left-hand column and number of symbols with those bitlengths in the right-hand column. The example bitlength values in histogram 120 shown in FIG. 1 illustrate associations where zero (0) encoded symbols have a bitlength of 1 bit; two (2) encoded symbols have a bitlength of 2 bits; one (1) encoded symbol has a bitlength of 3 bits; three (3) encoded symbols have a bitlength of 4 bits; and, so on, with 2 encoded symbols having a bitlength of 32 bits.

Histogram 120 is provided to address accumulator 121 and base code table generator 122. Address accumulator 121 processes histogram 120 to generate start address table 130. Histogram 120 may be provided to address accumulator 121 and/or and base code table generator 122 one entry at a time. In other words, histogram 120 may be provided to address accumulator 121 (or BCT generator 122) as a series of values that correspond to numerically ascending (or alternatively, descending) bit length values. Address accumulator 121 counts the number of encoded symbols that have a given bit length or less, and populates start address table 130 with these values. When fully populated, start address table 130 serves as an index, by encoded symbol bitlength, into symbol lookup table 150.

Start address table 130 is a table comprised of storage elements that relates the symbols of a given size (i.e., bit lengths) to the starting location in the symbol lookup table 150 of encoded symbols that have that size. In other words, SAT 130 associates the respective bitlengths of the encoded symbol values to the first location in the SLT 150 having an encoded symbol with that respective bitlength. In FIG. 1, SAT 130 is illustrated with the bit length values in the left-hand column and the corresponding start address in SLT 150 in the right-hand column. The example bitlength values shown in SAT 130 in FIG. 1 illustrate associations where there are zero (0) symbols having a bitlength of 1 bit; symbols having a bitlength of 2 bits start at index 0; symbols having a bitlength of 3 bits start at index 2; symbols having a bitlength of 4 bits start at index 3; symbols having a bitlength of 5 bits start at index 6; and, so on, with symbols having a bitlength of 32 bits starting at index 253.

Base code generator 122 processes histogram 120 to generate base code table 140. Base code generator 140 uses the rules for the construction of a Canonical Huffman Code to populate base code table 140. When fully populated, base code table 140 relates each encoded bitlength to the first (i.e., lowest numerical value) encoded symbol having that respective bitlength.

Base code table 140 is a table comprised of storage elements that relate the symbols of a given size (i.e., bit lengths) to the first encoded symbol having that respective size. In other words, BCT 140 associates the respective bitlengths of the encoded symbol values to the 'prefix' of the encoded symbols having that respective bitlength. In FIG. 1, BCT 140 is illustrated with the bit length values in the left-hand column and the corresponding base code (in binary) in the right-hand column. The example bitlength values shown in BCT 140 in FIG. 1 illustrate associations where there are zero (0) symbols having a bitlength of 1 bit—thus the entry is considered invalid (X); symbols having a bitlength of 2 bits start with the code 00b; symbols having a bitlength of 3 bits start with the code 100b; symbols having a bitlength of 4 bits start with the code 1010b; and, so on, with symbols having a bitlength of 32 bits starting with a code represented in FIG. 1 as 1 . . . 0b (e.g., FFFFFFFCh.)

In FIG. 1, the example base codes are illustrated having a least-significant bit (LSB) that is a '0'. In an embodiment, BCT 140 may not store that LSB value because it is the same for all entries. The number of base code bits stored in BCT should be no less than the minimum number of bits required to make all the entries in BCT 140 unique and/or unambiguous.

Bit length table 110 and start address table 130 are provided to lookup table generator 131. Lookup table generator 131 processes bit length table 110 using the entries in start address table 130 to populate symbol lookup table 150.

Symbol lookup table 150 is a table comprised of storage elements that relate an index value to a respective unencoded symbol. The index value is calculated from values received from the start address table. In other words, to generate symbol lookup table 150, BLT 150 is traversed in sequential order. Each entry in BLT 110 is, in turn, first indexed by bit length value into start address table 130 to determine where (i.e., which index value) in SLT 150 symbols of that size start. For each encoded symbol size, an offset (which is initially zero) from that location is then used to store the association between the index value and the symbol value of that BLT entry. The offset for that size of encoded symbol is then incremented so that the next BLT entry with that size will be associated with the 'next' index value. In this manner, because BLT 130 is traversed in sequential order, the associations in SLT 150 will correspond to a correct CHC as expressed by BLT 130.

In FIG. 1, SLT 150 is illustrated with the index values in the left-hand column and the corresponding unencoded symbol value in the right-hand column. In FIG. 1, SLT 150 is shown associating index 0 to symbol value 0; index 1 to symbol value 30; index 2 to symbol value 28, index 3 to symbol value 11; and, so on, with index 255 being associated with the symbol value 29.

SAT 130, BCT 140, and SLT 150 may be used by decode hardware (or software) to decode encoded symbols. Take, for example, the encoded symbol 01b that has a bit length of 2. The bit length of 2 can be indexed into BCT 140 to determine that the base code for 2 bit encoded symbols is 00b. The difference between the encoded symbol 01b and the base code 00b indicates the symbol 01b is one (1) index greater than the base code for 2 bit coded symbols. Thus, the entry for the symbol 01b in SLT 150 will be at the location that is one (01b−00b=1) index greater than the starting index for 2 bit symbols. The bit length of 2 can also be indexed into SAT 130 to retrieve the starting location of 2 bit symbols in SLT 150. The difference between the encoded symbol 01b and the base code 00b is added to that starting location to calculate the index (e.g., 3) in SLT 150 that holds the unencoded symbol (e.g., 11) that corresponds to the encoded symbol 01b.

Figure 2:
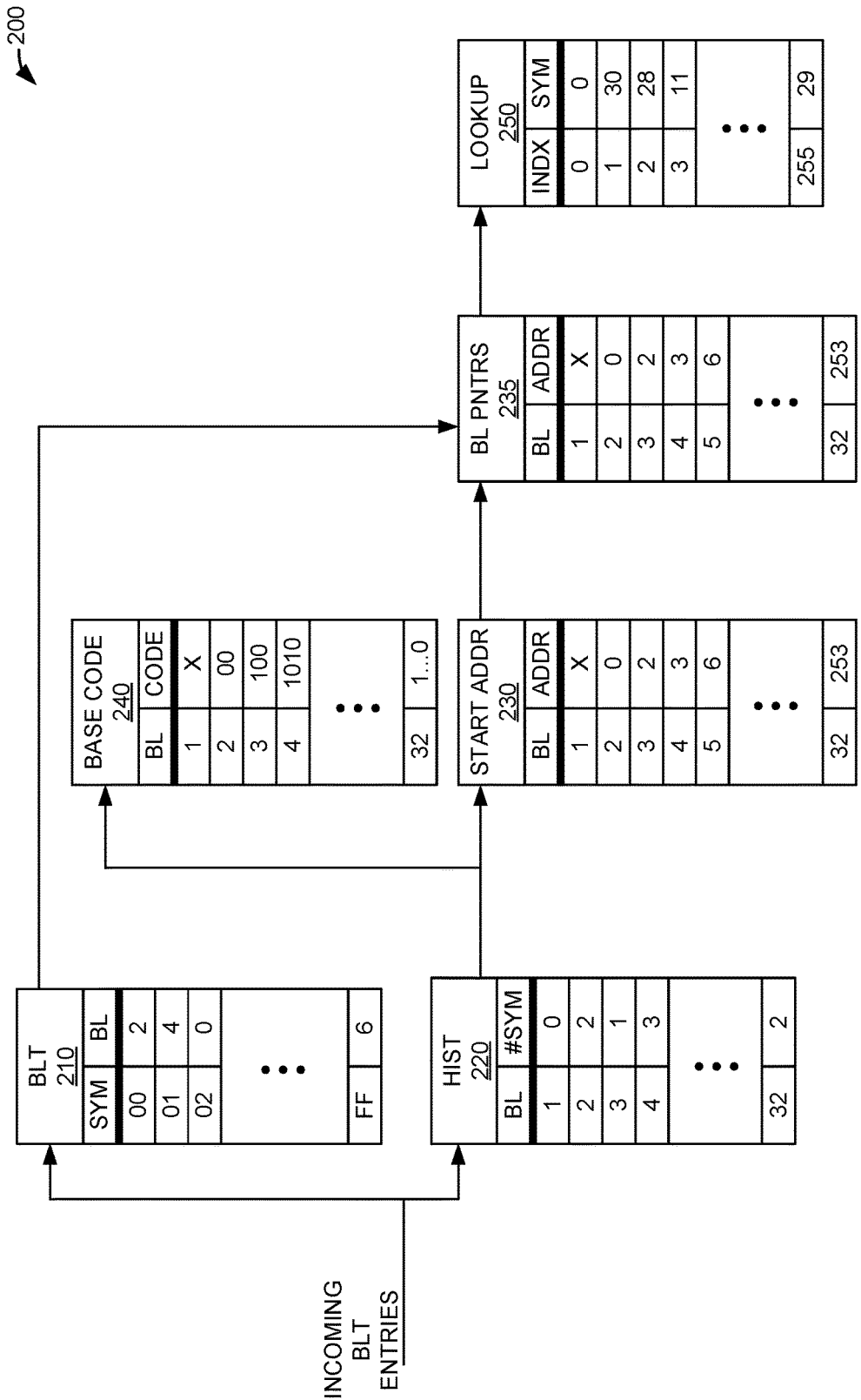
FIG. 2 is an illustration of an integrated circuit that performs a decode table decompression table process

In FIG. 2, the example base codes are illustrated having a least-significant bit (LSB) that is a '0'. In an embodiment, BCT 240 may not store that LSB value because it is the same for all entries. The number of base code bits stored in BCT should be no less than the minimum number of bits required to make all the entries in BCT 240 unique and/or unambiguous.

It should also be understood that values, and the ranges of numbers described herein are for illustration purposes. For example, the number of entries in BLT 110 and SLT 150 may be greater than or less than 256; the number of entries in the histogram 120, SAT 130, and BCT 240, may be greater than or less than 32. Likewise, the starting and ending values of the indexes in these tables may be different from those shown in FIG. 1.

FIG. 2 is an illustration of an integrated circuit that performs a decode table decompression table process. The decode table decompression process may be performed by an integrated circuit 200 that includes storage elements for bit length table 210, histogram table 220, start address table 230, base code table 240, bit length pointers 235, and lookup table 250. As bit length entries for each unencoded symbol are received, they are written to a bit length table 210, where the index to each entry in BLT 210 is the unencoded symbol value and the content is the bit length of the corresponding encoding of that symbol. In parallel to writing the BLT 210 entries to storage elements, a histogram 220 is generated from the BLT 210 entries. This histogram 220 relates the number of symbols at each bit length to the bit length (e.g., index=bit length, value=number of symbols).

When the histogram 220 is fully populated, a single pass through the histogram 220 generates the SAT 230 and the BCT 240. SAT 230 is a cumulative representation of histogram 220. BCT 240 is generated algorithmically based on the rules for creating base codes for Canonical Huffman Code trees. It should be noted that SAT 230 and BCT 240 may be populated in parallel. SAT 230 and BCT 240 may take different amounts of time/cycles to be populated.

SLT 250 is generated using a single pass through the entries of BLT 210. A set of bitlength pointers 235 into SLT 250 track a current location for each bit length. The table of bitlength pointers 235 helps to allow a single pass through the BLT 210 to create the SLT 250. For each entry in BLT 210, the bit length of that entry is used to write the corresponding symbol to the current entry in SLT 250 specified by the corresponding current pointer value for that bit length. The pointer for that bit length is then updated before the next BLT 210 entry is processed.

It should be understood that values, and the ranges of numbers described herein are for illustration purposes. For example, the number of entries in BLT 210 and SLT 250 may be greater than or less than 256; the number of entries in the histogram 220, SAT 230, BCT 240, and the number of bit length pointers 235, may be greater than or less than 32. Likewise, the starting and ending values of the indexes in these tables may be different from those shown in FIG. 2.

Figure 3:
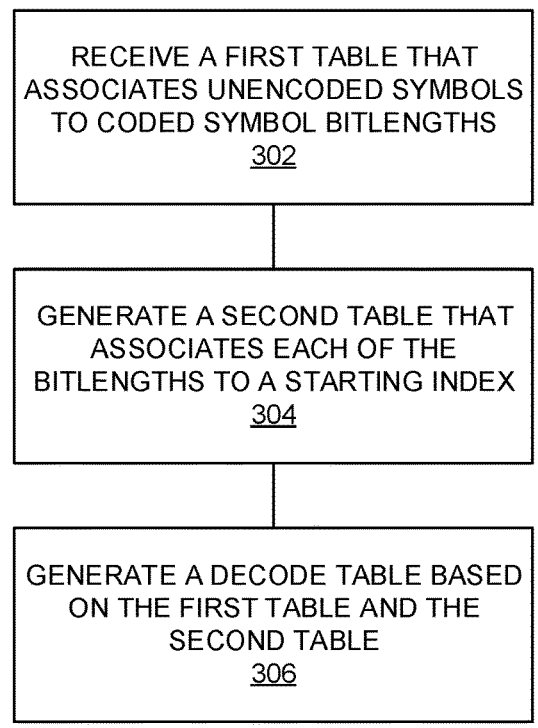
FIG. 3 is a flowchart illustrating a decode table generation process.

FIG. 3 is a flowchart illustrating a decode table generation process. The steps illustrated in FIG. 3 may be performed, for example, by one or more elements of integrated circuit 100 and/or integrated circuit 200. A first table that associates unencoded to symbols to coded symbols bit lengths is received (302). For example, histogram accumulator 111 may receive entries corresponding to bit length table 110. Histogram accumulator 111 may receive generate histogram table 120.

A second table that associates each of the bit length to a starting index is generated (304). For example, address accumulator 121 may, based on histogram 120 that was generated by histogram accumulator 111, generate start address table 130. A decode table based on the first table and the second table is generated (306). For example, lookup generator 131 may generate lookup table 150 based on start address table 130 and bit length table 110.

Figure 4:
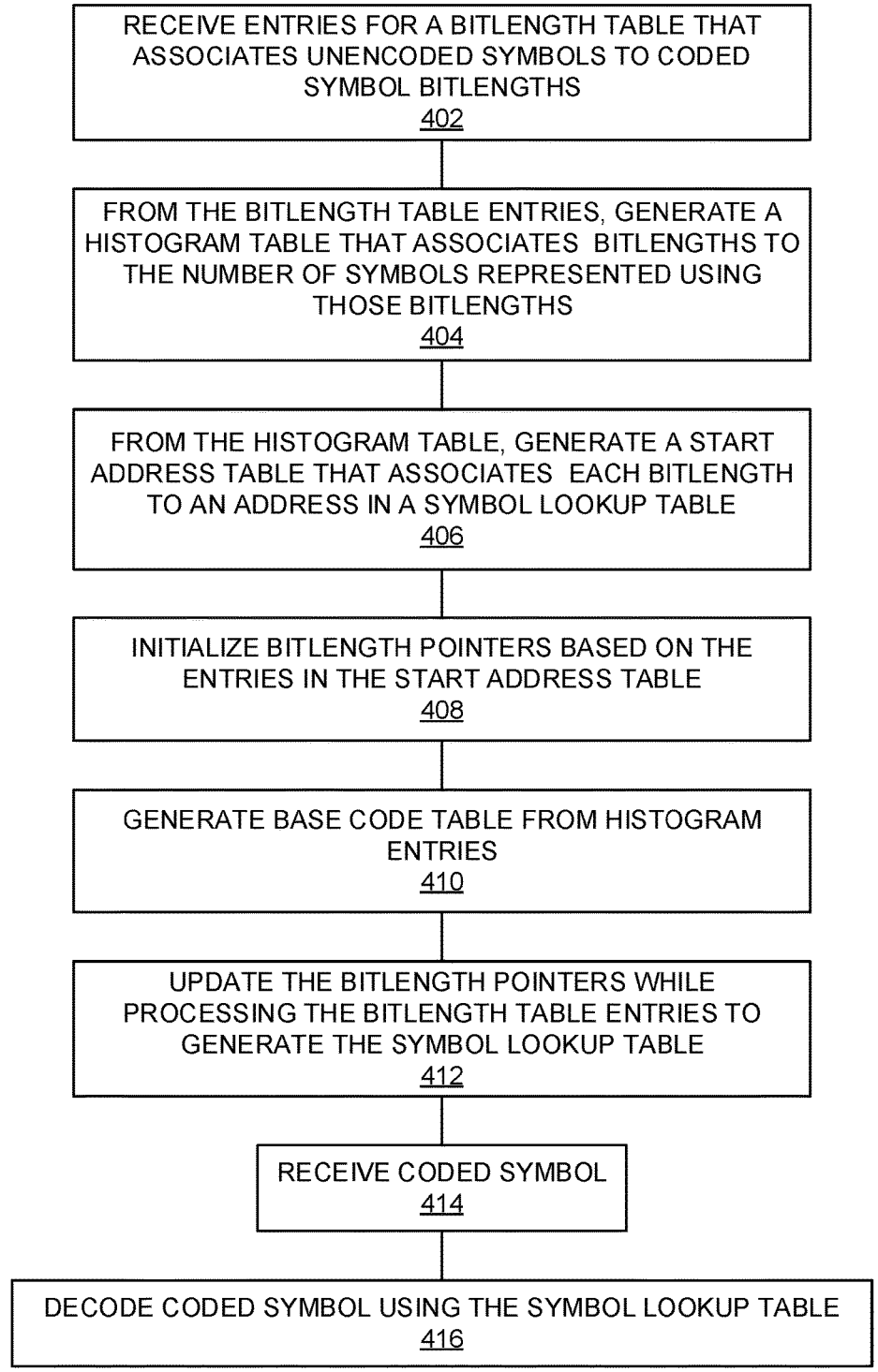
FIG. 4 is a flowchart illustrating a process for decoding at least one symbol.

FIG. 4 is a flowchart illustrating a process for decoding at least one symbol. The steps illustrated in FIG. 4 may be performed, for example, by one or more elements of integrated circuit 100 and/or integrated circuit 200. Entries for a bit length table that associates unencoded symbols to coded symbol bit lengths is received (402). For example, the entries to populate bit length table 210 may be received by integrated circuit 200.

From the bit length table entries, a histogram table that associates bit length to the number of symbols represented using those bit lengths is generated (404). For example, integrated circuit 200 may, in parallel to populating BLT 210, generate histogram table 220. From the histogram table, a start address table that associates each bit length to an address in a symbol lookup table is generated (406). For example, integrated circuit 200 may generate start address table 230 from the entries in histogram table 220.

Bit length pointers are initialized based on the entries in the start address table (408). For example, bit length pointers 235 may be initialized using the entries in start address table 230. The initial values of bit length pointers 235 may correspond to or equal the start address values in start address table 230.

A base code table is generated from the histogram industries (410). For example, base code table 240 may be generated from the entries in histogram 220. Base code table 240 may be generated in parallel with start address table 230. The bit length pointers are updated while processing the bit length table entries to generate the symbol lookup table (412). For example, as each bit length table entry is processed to generate symbol lookup table 250, the pointer 235 that corresponds to the bitlength of the BLT 210 entry being processed may be updated (e.g., incremented, decremented, etc.)

A coded symbol is received (414). For example, integrated circuit 200 may receive an encoded symbol. The coded symbol is decoded using the symbol lookup table (416). For example, base code table 240, start address table 230, and lookup table 250 may be used by integrated circuit 200 to decode the coded symbol.

Figure 5:
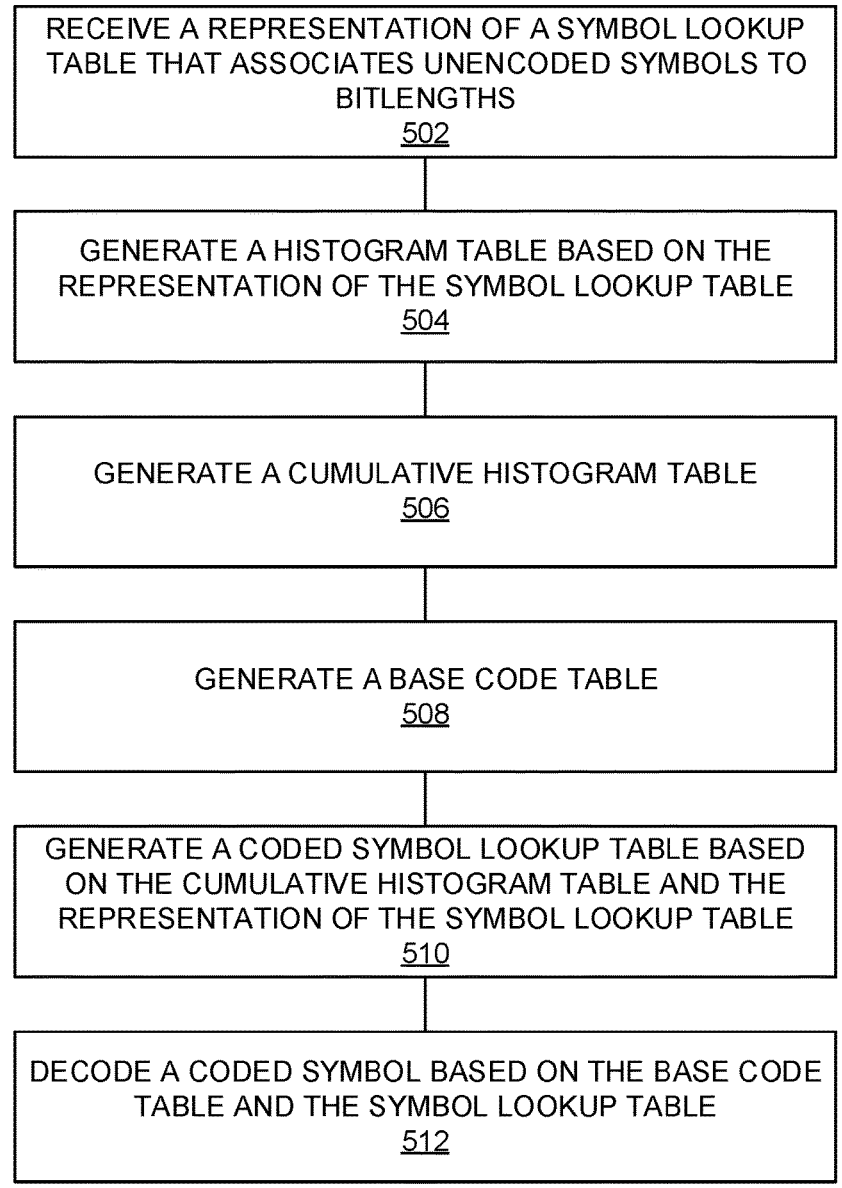
FIG. 5 is a flowchart illustrating a process for decoding a symbol lookup table and using it to decode a symbol.

FIG. 5 is a flowchart illustrating a process for decoding a symbol lookup table and using it to decode a symbol. The steps illustrated in FIG. 5 may be performed, for example, by one or more elements of integrated circuit 100 and/or integrated circuit 200. A representation of a symbol lookup table that associates unencoded symbols to bit lengths is received (502). For example, bit length table 210 entries that associate unencoded symbols to the bit lengths used to encode these symbols may be received.

A histogram table based on the representation of the symbol lookup table is generated (504). For example, as bit length table 210 is being populated with received entries, histogram table 220 that relates each bit length to the number of encoded symbols using that bit length may also be generated in parallel. A cumulative histogram table is generated (506). For example, based on histogram table 220, integrated circuit 200 may generate start address table 230. A base code table is generated (508). For example, based on histogram table 220, integrated circuit 200 may generate base code table 240.

A coded symbol lookup table is generated based on the cumulative histogram table and the representation of the symbol lookup table (510). For example, integrated circuit 200 may generate, based on bit length table 210 and start address table 230, lookup table 250. A coded symbol is decoded based on the base code table and the symbol lookup table (512). For example, integrated circuit 200 may, based on base code table 240 and symbol lookup table 250, decode coded symbols.

Figure 6:
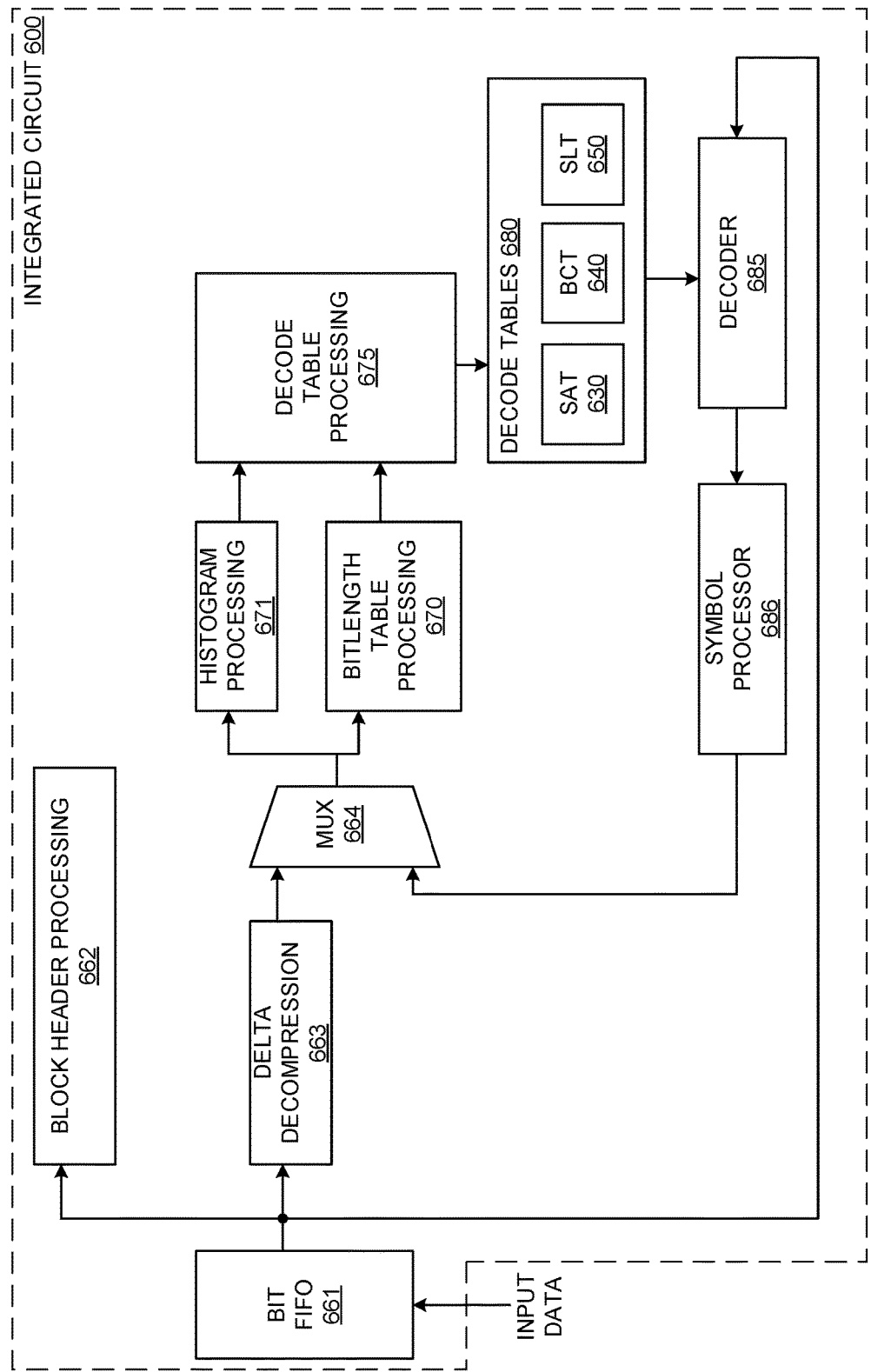
FIG. 6 is a block diagram illustrating an integrated circuit for decoding symbol tables and symbols.

FIG. 6 is a block diagram illustrating an integrated circuit for decoding symbol tables and symbols. In FIG. 6, integrated circuit 600 includes bit first-in first-out (FIFO) buffer 661, block header processing 662, Delta decompression 663, multiplexer 664, bit length table processing 670, histogram processing 671, decode table processing 675, decode tables 680, decoders 685, and symbol processor 686. Decode tables 680 includes start address table 630, base code table 640, and symbol lookup table 650.

Bit FIFO 661 receives input data. This input data may include an encoded and/or compressed representation of the canonical Huffman code tree. Integrated circuit 600 may decode this representation into decode tables 680. Integrated circuit 600 may use decode table 6802 decompress other canonical Huffman code trees and/or compressed data.

Bit FIFO 661 is operatively coupled to block header processing 662, Delta decompression 663, and decoders 685. Delta decompression 663 is operatively coupled to multiplexer 664. Multiplexer 664 receives symbols from delta decompression 663 and symbol processor 686 and provides them to histogram processing 671 and bit length table processing 670. The output of this histogram processing 671, is provided to decode table processing 675. The output of bit length table processing 670 is provided to decode table processing 675. The output of decode table processing 675 are decode tables 680 that can be used by decoder 685 to decode/decompress a data stream. The output of decode table processing 675 are decode tables 680 that can be used by integrated circuit 600 to decode/decompress canonical Huffman code trees that are later used to decode/decompress a data stream. The output of decoder 685 is provided to symbol processor 686. The output of symbol processor 686 is provided to multiplexer 664.

Decoder 685 receives decode tables 680 which include SAT 630, BCT 640, and SLT 650. Together, SAT 630, BCT 640, and SLT 650 fully specify an arbitrary Canonical Huffman tree. SAT 630 contains the start address in SLT 650 for each set of symbol bit lengths (i.e., each CHC tree level). The number of entries in SAT is equivalent to the number of levels of the Huffman tree represented by SAT 630, BCT 640, and SLT 650. BCT 640 specifies the base code for each set of symbol bit lengths (i.e., each CHC tree level). SLT 650 contains decoded symbol values. The symbols that are programmed at each value are determined by SAT 630 and BCT 640.

As bit lengths for each symbol is determined (i.e., by delta decompression 663 or symbol processor 686), they are written to a bit length table (e.g., BLT 210) by bitlength table processing 670, where the index is the symbol value and the contents are the bit length of the encoded symbol used to represent the symbol in the coded data stream. In parallel to writing the BLT, the bit lengths are captured to a histogram by histogram processing 670. The histogram captures the number of symbols having each bit length (e.g., index: bit length, value: number of symbols). When the histogram processing 671 has been completed, a single pass through the histogram can generate SAT 630 and BCT 640.

The SAT 630 is a cumulative representation of the histogram. BCT 540 is generated algorithmically based on the rules to create base codes for canonical Huffman trees. SAT 630 and BCT 640 can be built from the histogram at different rates. To create SLT 650 using a single pass through the BLT, a set of pointers into SLT 650 that track the current location for each bit length. This pointer table allows us to use a single pass through the BLT to create the SLT. For each entry in the BLT, the bit length associated with that entry is used to select a pointer and the selected pointer is used to write the symbol to the entry in the SLT pointed to by that pointer. The selected pointer is then updated (e.g., incremented.)

The method of unpacking described herein enables unpacking of a Huffman table that is externally stored in the standard bit-length table (BLT) format. The externally stored Huffman table can be unpacked using SAT 630 which is the cumulative histogram of the BLT. The cumulative stored histogram allows the hardware to immediately start populating the internal decode table when SAT 630 is fully populated, lowering overall latency.

A linear traversal of the histogram and the BLT leads to poor latency. For very small block sizes, this latency can be significant. BCT 640 can be built in parallel with building SLT 650. However, building BCT 640 will typically be faster than building SLT 650. Thus, building the SLT 650 will typically determine overall latency.

In an embodiment, two general approaches for latency optimization may be used for tuning per application requirements. A first set of optimizations is better for sparse bit length tables. Depending on the compression format begin decompressed/decoded, a significant number of BLT entries will be 0/invalid/unused. This is particularly true for small data blocks. These optimizations are be slow for fully populated BLT tables. However, in these cases, the table unpacking latency is generally insignificant to the overall processing time. A second set of optimization is better fully populated tables.

All tables (e.g., BLT 210, histogram 220, BCT 240, SAT 230, and/or SLT 250, etc.) may include a valid register for each entry that is initialized to 0. Any entry with valid 0 is treated as if the actual value is 0. This means that entries that are set to 0 don't need to be written and some writes can be skipped regardless of whether the underlying table is mapped to a memory or a register set. This can be advantageous for table updates that affect multiple entries, such as the zero fill commands in the compression standards XPress9 and/or Xpress10. In this case, the zero fill commands only cause an update the current entry pointer (e.g., pointers 235), instead of writing 0's.

Tables in the table decompression process are often sparse. The level of sparsity typically increases as the data sizes increases. To decrease processing time with decreasing data size, table (e.g., BLT 210, histogram 220, BCT 240, SAT 230, and/or SLT 250, etc.) may be instrumented a with valid bit per entry (can be stored in a register). These valid bits can be fed to a flash binary search circuit. This allows the access pointers to jump to the next valid address in the following cycle. The entry then needs to be invalidated after access. Also, note that the valid registers can be reset to 0. Thus, any invalid entry can be always treated as 0 without actually writing to the corresponding entry.

Traversing the BLT is mostly dependent on completing the cumulative histogram (start addresses). Using parallel adder trees, multiple entries per cycle can be accumulated from the histogram to generate the cumulative Histogram. BCT 640 can be built while SLT 650 is constructed by walking the BLT.

Latency of the table construction can be additionally reduced by reading and/or writing multiple entries per cycle to BLT, Histogram, and SLT. Writing multiple entries to the BLT requires chained Huffman decoders (when the lengths are Huffman encoded in the header), but this can be reasonably done as the Huffman Decoders can quickly determine Huffman Symbol boundaries as a short timing path. Writing multiple entries to the SLT can be done with the SLT and Pointer tables having multiple independent write and read ports.

Figure 7:
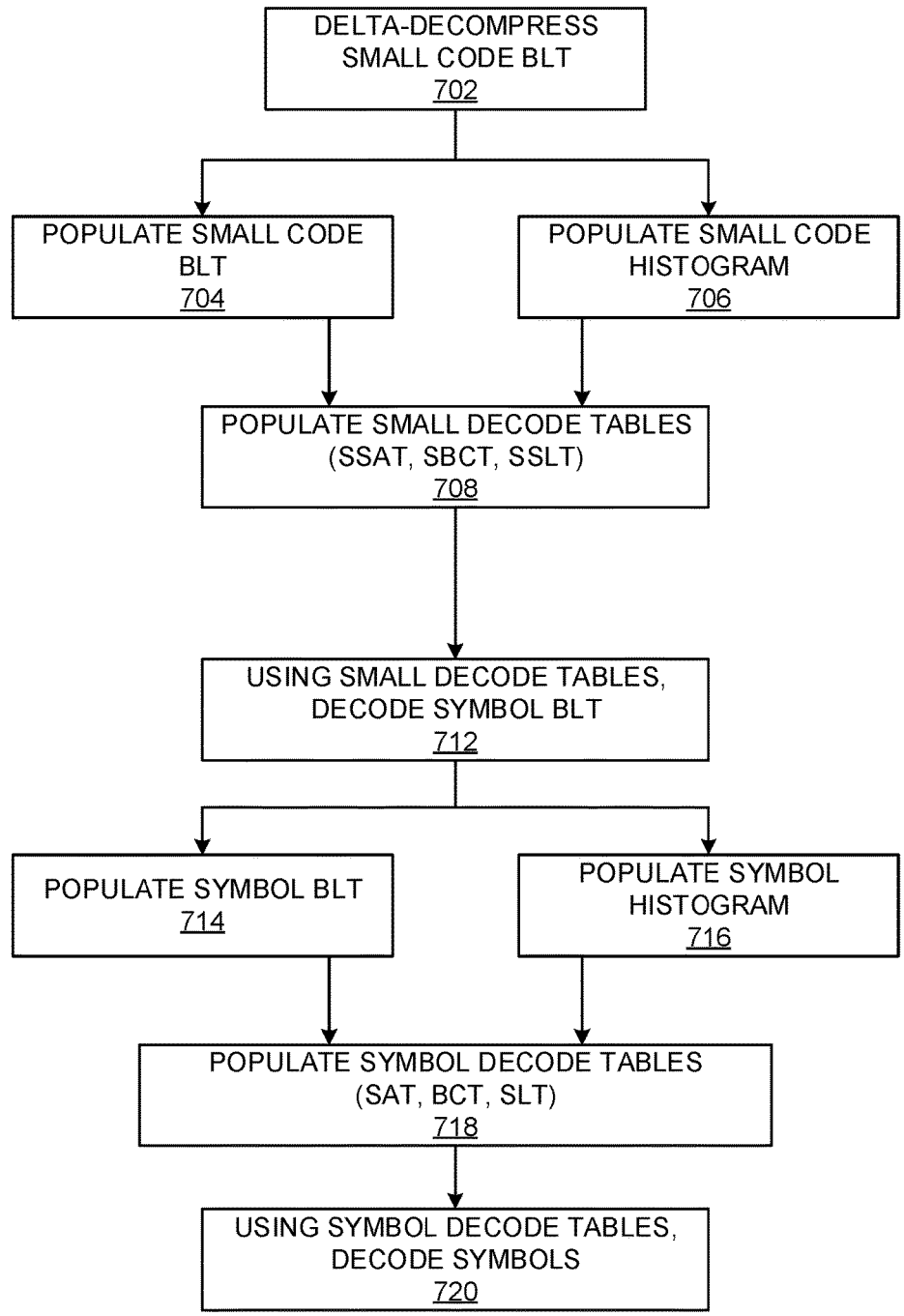
FIG. 7 is an illustration of a process for decoding symbol tables.

FIG. 7 is an illustration of a process for decoding symbol tables. The steps illustrated in FIG. 3 may be performed, for example, by one or more elements of integrated circuit 100, integrated circuit 200, and/or integrated circuit 200. A small code bit length table is Delta decompressed (702). For example, delta decompression 663 may decompress a small code bit length table. The small code bit length table may represent a Huffman code tree that will be used in subsequent steps to decode another Huffman code tree.

A table to hold the small code bit length table is populated (704). In parallel with populating the small code bit length table, a small code histogram is populated (706). For example, histogram processing 671 and bit length table processing 670 may be operated in parallel to generate histogram and a bit length table for the Huffman code tree received from delta decompression 663.

The small decode tables are populated (708). The decode tables that are populated may include a small start address table (SSAT), a small base code table (SBCT), and a small code symbol lookup table (SSLT). These decode tables may be populated by decode table processing 675 and stored in decode tables 680. These decode tables may be provided to decoder 685 in order to decode another Huffman code tree that is in the data stream.

A symbol bit length table is decoded using the small decode tables (712). For example, the small start address table, small base code table, and small code symbol lookup table may all be used by decoder 685 to decode a compressed Huffman code bit length table that represents a Huffman tree that will eventually be used (e.g., by decoder 685) to decode data symbols.

A table to hold the symbol code bit length table is populated (714). In parallel with populating the symbol code bit length table, a symbol code histogram is populated (716). For example, histogram processing 671 and been bit length table processing 670 may be operated in parallel to generate histogram and a bit length table for the Huffman code tree received from decoder 685 and symbol processor 686.

The symbol decode tables are populated (718). The decode tables that are populated may include a start address table (SAT), a base code table (BCT), and a symbol lookup table (SLT). These decode tables may be populated by decode table processing 675 and stored in decode tables 680.

The symbol decode tables are used to decode symbols (720). For example, the decode tables (SAT, BCT, SLT) may be provided to decoder 685 in order to decode/decompress the data stream. It should be understood that the steps illustrated in FIG. 7 may be performed multiple times in order to extract Huffman trees and build the decode tables necessary to decompress a block of data. For example, some compression standards specify two (or more) decode trees: one for short symbols and one for long symbols. In this case, the process illustrated in FIG. 7 may be performed twice. Once to build the short symbol decode tables and again to build the long symbol decode tables.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of integrated circuit 100, integrated circuit 200, and/or integrated circuit 600, and their components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Figure 8:
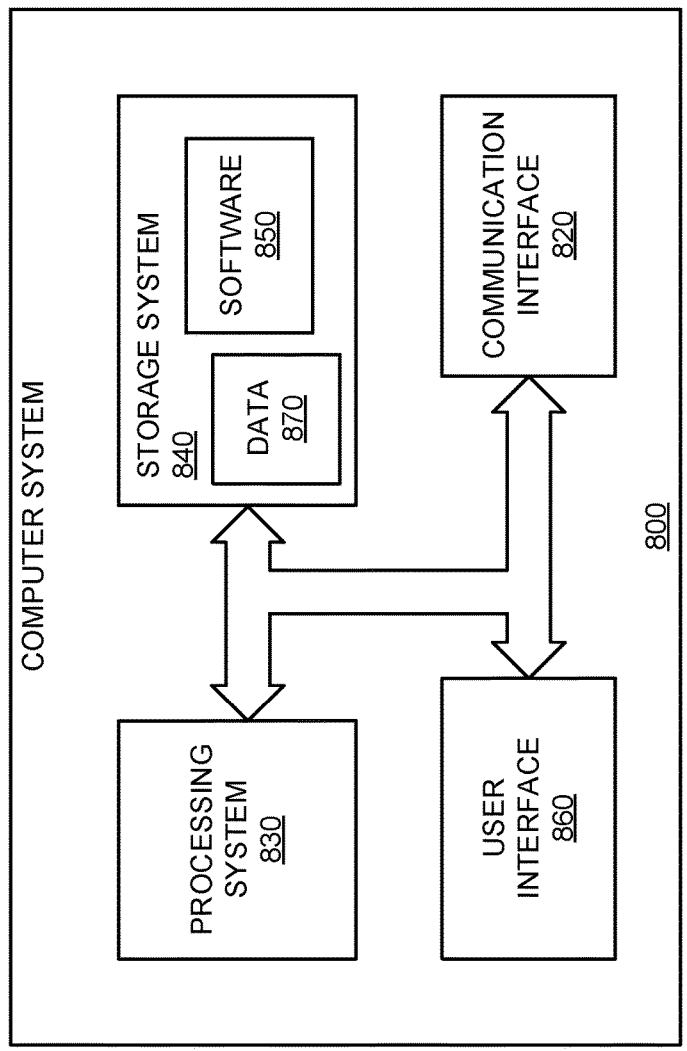
FIG. 8 is a block diagram illustrating a computer system.

FIG. 8 is a block diagram of a computer system. In an embodiment, computer system 800 and/or its components include circuits, software, and/or data that implement, or are used to implement, the methods, systems and/or devices illustrated in the Figures, the corresponding discussions of the Figures, and/or are otherwise taught herein.

Computer system 800 includes communication interface 820, processing system 830, storage system 840, and user interface 860. Processing system 830 is operatively coupled to storage system 840. Storage system 840 stores software 850 and data 870. Processing system 830 is operatively coupled to communication interface 820 and user interface 860. Storage system 840 and/or communication interface 820 are examples of a subsystems that may include integrated circuit 100, integrated circuit 200, integrated circuit 600 and/or their components.

Computer system 800 may comprise a programmed general-purpose computer. Computer system 800 may include a microprocessor. Computer system 800 may comprise programmable or special purpose circuitry. Computer system 800 may be distributed among multiple devices, processors, storage, and/or interfaces that together comprise elements 820-970.

Communication interface 820 may comprise a network interface, modem, port, bus, link, transceiver, or other communication device. Communication interface 820 may be distributed among multiple communication devices. Processing system 830 may comprise a microprocessor, microcontroller, logic circuit, or other processing device. Processing system 830 may be distributed among multiple processing devices. User interface 860 may comprise a keyboard, mouse, voice recognition interface, microphone and speakers, graphical display, touch screen, or other type of user interface device. User interface 860 may be distributed among multiple interface devices. Storage system 840 may comprise a disk, tape, integrated circuit, RAM, ROM, EEPROM, flash memory, network storage, server, or other memory function. Storage system 840 may include computer readable medium. Storage system 840 may be distributed among multiple memory devices.

Processing system 830 retrieves and executes software 850 from storage system 840. Processing system 830 may retrieve and store data 870. Processing system 830 may also retrieve and store data via communication interface 820. Processing system 850 may create or modify software 850 or data 870 to achieve a tangible result. Processing system may control communication interface 820 or user interface 860 to achieve a tangible result. Processing system 830 may retrieve and execute remotely stored software via communication interface 820.

Software 850 and remotely stored software may comprise an operating system, utilities, drivers, networking software, and other software typically executed by a computer system. Software 850 may comprise an application program, applet, firmware, or other form of machine-readable processing instructions typically executed by a computer system. When executed by processing system 830, software 850 or remotely stored software may direct computer system 800 to operate as described herein.

Implementations discussed herein include, but are not limited to, the following examples:

Example 1

An integrated circuit to decode data compressed with a variable length code expressed in canonical form, comprising: storage elements for a first table to associate a plurality of unencoded symbols to a corresponding plurality of coded symbol bitlengths, each of the plurality of coded symbol bitlengths corresponding to a count of bits used by the variable length code to encode a corresponding unencoded symbol; storage elements for a second table that associates each of the corresponding plurality of bitlengths to a respective starting index; circuitry to generate the second table; circuitry to store the second table in the storage elements for the second table; storage elements for a decode lookup table; circuitry to generate the decode lookup table based on the first table and the second table; and, circuitry to store the decode lookup table in the storage elements for the decode lookup table.

Example 2

The integrated circuit of example 1, further comprising: storage elements for a third table that associates each of the corresponding plurality of bitlengths to a respective number of unencoded symbols having a respective coded symbol bitlength;
circuitry to generate the third table based on the first table; and, circuitry to store the third table in the storage elements for the third table.

Example 3

The integrated circuit of example 2, wherein the second table is generated based on the third table.

Example 4

The integrated circuit of example 1, the canonical form corresponds to a canonical Huffman code.

Example 5

The integrated circuit of example 1, further comprising: circuitry to receive a coded symbol; and, decode circuitry to, based on the coded symbol, the second table, and the decode lookup table, select an unencoded symbol from the that corresponds to the coded symbol.

Example 6

The integrated circuit of example 5, further comprising: storage elements for a fourth table that associates each of the corresponding plurality of bitlengths to a respective base code symbol; and, circuitry to generate the fourth table based on the first table.

Example 7

The integrated circuit of example 6, further comprising: circuitry to receive a coded symbol; and, circuitry to select an unencoded symbol value from the decode lookup table based on the coded symbol and an index value stored in the fourth table.

Example 8

A method of generating a decode lookup table to decode a variable length code expressed in canonical form, comprising: receiving a first table that associates a plurality of unencoded symbols to a corresponding plurality of coded symbol bitlengths, each of the plurality of coded symbol bitlengths corresponding to a count of bits used by the variable length code to encode a corresponding unencoded symbol; generating a second table that associates each of the corresponding plurality of bitlengths to a respective starting index; and, generating the decode lookup table based on the first table and the second table.

Example 9

The method of example 8, further comprising: based on the first table, generating a third table that associates each of the corresponding plurality of bitlengths to a respective number of unencoded symbols having a respective coded symbol bitlength.

Example 10

The method of example 9, wherein the second table is based on the third table.

Example 11

The method of example 8, wherein the canonical form corresponds to a canonical Huffman code.

Example 12

The method of example 8, further comprising: receiving a coded symbol; and, based on the coded symbol, the second table, and the decode lookup table, decoding the coded symbol by selecting an unencoded symbol from the symbol lookup table that corresponds to the coded symbol.

Example 13

The method of example 12, wherein selecting the unencoded symbol comprises: generating a fourth table that associates each of the corresponding plurality of bitlengths to a respective base code symbol.

Example 14

The method of example 13, further comprising: receiving a coded symbol; using a coded symbol bitlength associated with the coded symbol and the fourth table to generate an index into the decode lookup table; and, based on the index, selecting an unencoded symbol from the decode lookup table that corresponds to the coded symbol.

Example 15

An integrated circuit to decompress data compressed with a variable length coding scheme, comprising: decompression circuitry to receive the compressed data and to, based on a symbol lookup table, produce decompressed data; and, table decompression circuitry to receive a representation of the symbol lookup table, the representation of the symbol lookup table including a plurality of coded symbol bitlengths corresponding to a count of bits used by the variable length coding to encode a corresponding unencoded symbol, the table decompression circuitry to produce a symbol lookup table suitable for decoding from the representation of the symbol lookup table by at least: generating a cumulative histogram table that associates each of the corresponding plurality of bitlengths to a respective starting index in the symbol lookup table; and, generating the symbol lookup table based on the representation of the symbol lookup table and the cumulative histogram table.

Example 16

The integrated circuit of example 15, wherein the table decompression circuitry further: generates, based on the representation of the symbol lookup table, a histogram table that associates each of the corresponding plurality of bitlengths to a respective number of unencoded symbols having a respective coded symbol bitlength.

Example 17

The integrated circuit of example 16, wherein the table decompression circuitry further: generates, based on the representation of the symbol lookup table, a base code table that associates each of the corresponding plurality of bitlengths to a respective base code symbol in the symbol lookup table.

Example 18

The integrated circuit of example 17, wherein the representation of the symbol lookup table is stored in a bitlength table that associates the plurality of unencoded symbols to the corresponding plurality of coded symbol bitlengths.

Example 19

The integrated circuit of example 18, wherein the table decompression circuitry processes multiple entries in the bitlength table concurrently.

Example 20

The integrated circuit of example 15, wherein the symbol lookup table of the variable length coding scheme represents a canonical Huffman tree.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. An integrated circuit to decode data compressed with a variable length code expressed in canonical form, comprising:
    storage elements for a first table to associate a plurality of unencoded symbols to a corresponding plurality of coded symbol bitlengths, each of the plurality of coded symbol bitlengths corresponding to a count of bits used by the variable length code to encode a corresponding unencoded symbol;
    storage elements for a second table that associates each of the corresponding plurality of bitlengths to a respective starting index;
    circuitry to generate the second table;

circuitry to store the second table in the storage elements for the second table;
storage elements for a decode lookup table;
circuitry to generate the decode lookup table based on the first table and the second table; and,
circuitry to store the decode lookup table in the storage elements for the decode lookup table.

2. The integrated circuit of claim 1, further comprising:
storage elements for a third table that associates each of the corresponding plurality of bitlengths to a respective number of unencoded symbols having a respective coded symbol bitlength;
circuitry to generate the third table based on the first table; and,
circuitry to store the third table in the storage elements for the third table.

3. The integrated circuit of claim 2, wherein the second table is generated based on the third table.

4. The integrated circuit of claim 1, the canonical form corresponds to a canonical Huffman code.

5. The integrated circuit of claim 1, further comprising:
circuitry to receive a coded symbol; and,
decode circuitry to, based on the coded symbol, the second table, and the decode lookup table, select an unencoded symbol from the that corresponds to the coded symbol.

6. The integrated circuit of claim 5, further comprising:
storage elements for a fourth table that associates each of the corresponding plurality of bitlengths to a respective base code symbol; and,
circuitry to generate the fourth table based on the first table.

7. The integrated circuit of claim 6, further comprising:
circuitry to receive a coded symbol; and,
circuitry to select an unencoded symbol value from the decode lookup table based on the coded symbol and an index value stored in the fourth table.

8. A method of generating a decode lookup table to decode a variable length code expressed in canonical form, comprising:
receiving a first table that associates a plurality of unencoded symbols to a corresponding plurality of coded symbol bitlengths, each of the plurality of coded symbol bitlengths corresponding to a count of bits used by the variable length code to encode a corresponding unencoded symbol;
generating a second table that associates each of the corresponding plurality of bitlengths to a respective starting index; and,
generating the decode lookup table based on the first table and the second table.

9. The method of claim 8, further comprising:
based on the first table, generating a third table that associates each of the corresponding plurality of bitlengths to a respective number of unencoded symbols having a respective coded symbol bitlength.

10. The method of claim 9, wherein the second table is based on the third table.

11. The method of claim 8, wherein the canonical form corresponds to a canonical Huffman code.

12. The method of claim 8, further comprising:
receiving a coded symbol; and,
based on the coded symbol, the second table, and the decode lookup table, decoding the coded symbol by selecting an unencoded symbol from the symbol lookup table that corresponds to the coded symbol.

13. The method of claim 12, wherein selecting the unencoded symbol comprises:
generating a fourth table that associates each of the corresponding plurality of bitlengths to a respective base code symbol.

14. The method of claim 13, further comprising:
receiving a coded symbol;
using a coded symbol bitlength associated with the coded symbol and the fourth table to generate an index into the decode lookup table; and,
based on the index, selecting an unencoded symbol from the decode lookup table that corresponds to the coded symbol.

15. An integrated circuit to decompress data compressed with a variable length coding scheme, comprising:
decompression circuitry to receive the compressed data and to, based on a symbol lookup table, produce decompressed data; and,
table decompression circuitry to receive a representation of the symbol lookup table, the representation of the symbol lookup table including a plurality of coded symbol bitlengths corresponding to a count of bits used by the variable length coding to encode a corresponding unencoded symbol, the table decompression circuitry to produce a symbol lookup table suitable for decoding from the representation of the symbol lookup table by at least:
generating a cumulative histogram table that associates each of the corresponding plurality of bitlengths to a respective starting index in the symbol lookup table; and,
generating the symbol lookup table based on the representation of the symbol lookup table and the cumulative histogram table.

16. The integrated circuit of claim 15, wherein the table decompression circuitry further:
generates, based on the representation of the symbol lookup table, a histogram table that associates each of the corresponding plurality of bitlengths to a respective number of unencoded symbols having a respective coded symbol bitlength.

17. The integrated circuit of claim 16, wherein the table decompression circuitry further:
generates, based on the representation of the symbol lookup table, a base code table that associates each of the corresponding plurality of bitlengths to a respective base code symbol in the symbol lookup table.

18. The integrated circuit of claim 17, wherein the representation of the symbol lookup table is stored in a bitlength table that associates the plurality of unencoded symbols to the corresponding plurality of coded symbol bitlengths.

19. The integrated circuit of claim 18, wherein the table decompression circuitry processes multiple entries in the bitlength table concurrently.

20. The integrated circuit of claim 15, wherein the symbol lookup table of the variable length coding scheme represents a canonical Huffman tree.

* * * * *